(12) United States Patent
Stojakovic et al.

(10) Patent No.: US 6,984,529 B2
(45) Date of Patent: Jan. 10, 2006

(54) FABRICATION PROCESS FOR A MAGNETIC TUNNEL JUNCTION DEVICE

(75) Inventors: George Stojakovic, Hopewell Junction, NY (US); Rajiv M. Ranade, Brewster, NY (US); Ihar Kasko, Fishkill, NY (US); Joachim Neutzel, Fishkill, NY (US); Keith R. Milkove, Beacon, NY (US); Russell D. Allen, Mahopac, NY (US); Young Hoon Lee, deceased, late of Hartsdale, NY (US); by Kim Poong Mee Lee, legal representative, Hartsdale, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 120 days.

(21) Appl. No.: 10/659,136

(22) Filed: Sep. 10, 2003

(65) Prior Publication Data

US 2005/0051820 A1    Mar. 10, 2005

(51) Int. Cl.
*H01L 21/027* (2006.01)
(52) U.S. Cl. ....................................... 438/3
(58) Field of Classification Search .................. 438/3, 438/734–736, 738, 740, 742; 216/22
See application file for complete search history.

(56) References Cited

U.S. PATENT DOCUMENTS

| | | | |
|---|---|---|---|
| 5,640,343 A | 6/1997 | Gallagher et al. | |
| 5,650,958 A | 7/1997 | Gallagher et al. | |
| 6,385,082 B1 | 5/2002 | Abraham et al. | |
| 6,518,588 B1 * | 2/2003 | Parkin et al. ................... | 257/3 |
| 6,538,919 B1 | 3/2003 | Abraham et al. | |
| 6,689,622 B1 * | 2/2004 | Drewes .......................... | 438/3 |
| 6,707,084 B2 * | 3/2004 | Katti et al. ................. | 257/295 |
| 6,806,096 B1 * | 10/2004 | Kim et al. ...................... | 438/3 |
| 6,897,532 B1 * | 5/2005 | Schwarz et al. ............ | 257/367 |
| 2003/0206434 A1 * | 11/2003 | Leuschner ................... | 365/173 |
| 2004/0014245 A1 * | 1/2004 | Motoyoshi ..................... | 438/3 |
| 2004/0188732 A1 * | 9/2004 | Fukuzumi .................... | 257/295 |

OTHER PUBLICATIONS

Kim, H.W., et al., "Effect Of Ti-Mask Addition And Temperature Elevation On $O_2/Cl_2$ Plasma Etching Of Pt," Journal of the Korean Physical Society, vol. 42, No. 5 (May 2003) pp. 667-670.

Kim, H.W., et al., "High Temperature Platinum Etching Using Ti Mask Layer," J. Vac. Sci. Technol., vol. A 17, No. 4 (Jul.-Aug. 1999) pp. 2151-2155.

Eisenbraun, E., et al., "Integration of CVD W- and Ta-Based Liners For Copper Metallization," Semiconductor Online (Jan. 19, 2000) pp. 1-4.

* cited by examiner

Primary Examiner—Craig A. Thompson
Assistant Examiner—Jennifer M Dolan
(74) Attorney, Agent, or Firm—Slater & Matsil, L.L.P.

(57) ABSTRACT

A method of fabricating a magnetic tunnel junction (MTJ) device is provided. A patterned hard mask is oxidized to form a surface oxide thereon. An MTJ stack is etched in alignment with the patterned hard mask after the oxidizing of the patterned hard mask. Preferably, the MTJ stack etch recipe includes chlorine and oxygen. Etch selectivity between the hard mask and the MTJ stack is improved.

29 Claims, 11 Drawing Sheets

FABRICATION PROCESS FOR A MAGNETIC TUNNEL JUNCTION DEVICE

TECHNICAL FIELD

The present invention relates generally to the fabrication of semiconductor devices, and more specifically to the fabrication of magnetic tunnel junction devices, such as magnetic random access memory (MRAM) devices.

BACKGROUND

A recent development in memory devices involves spin electronics, which combines principles of semiconductor technology and magnetism. The electron spin, rather than the charge, may be used to indicate the presence of a "1" or "0" binary state in a magnetic tunnel junction device. One such spin electronics device is a magnetic random access memory (MRAM) device. FIG. 1 illustrates a simplified schematic for a portion of a typical MRAM device 20. In an MRAM device 20, conductive lines 22 (i.e., word lines and bit lines) may be positioned perpendicular to each other in different metal layers. The conductive lines 22 sandwich a magnetic tunnel junction (MTJ) 30. Each MTJ 30 includes at least two magnetic layers 31, 32 separated by a tunnel barrier layer 34 between them. The storage mechanism relies on the relative orientation of the magnetization of the two magnetic layers 31, 32, and the ability to discern or sense this orientation electrically through electrodes (i.e., the conductive lines 22) attached to these magnetic layers 31, 32. Hence, digital information represented as a "0" or "1" is storable in the relative alignment of magnetic moments in each MTJ 30. For general background regarding MTJ devices and MRAM devices, reference may be made to U.S. Pat. Nos. 6,538,919, 6,385,082, 5,650,958, and/or 5,640,343, for example. Each of these patents is incorporated herein by reference.

In a magnetic tunnel junction device 20, it is essential that the two magnetic layers 31, 32 in each MTJ 30 are isolated from each other by the tunnel barrier layer 34. Although shown as single layers for purposes of simplifying the illustration, the magnetic layers 31, 32 are typically each formed of multiple stacked layers of various materials. FIGS. 2 and 3 illustrate a typical process for forming a MTJ 30 for a magnetic tunnel junction device 40 (e.g., an MRAM device). FIG. 2 is a cross-section view showing unpatterned magnetic tunnel junction layers 29 formed over an underlying layer, which includes a conducting line 22 (e.g., a word line or a bit line) formed in an insulating layer 44. The magnetic tunnel junction layers 29 include two magnetic layers 31, 32 with a tunnel barrier layer 34 sandwiched there between. A hard mask 42 is located atop the upper magnetic layer 31. At this stage, the hard mask 42 has already been etched and patterned. Next in this conventional process, both magnetic layers 31, 32, along with the tunnel barrier layer 34, are etched in alignment with the hard mask 42 using an etching process, such as wet etching, reactive ion etching (RIE), or ion milling, for example. RIE is preferred for its ability to anisotropically etch in a controlled direction (e.g., to provide vertical sidewalls for the MTJ 30). FIG. 3 shows the MTJ 30 formed from such process. Note that a portion of the hard mask 42 may remain after this step, as shown in FIG. 3, and any remaining hard mask 42 may be later removed, if so desired or needed.

Although RIE and ion milling provide the advantage of anisotropic (directional) removal of material, the main drawback of RIE and ion milling is the discharge of displaced particles being removed during the process, which can be projected in many different directions. Hence, a major concern and problem with the above-described process of forming the MTJ 30 (see FIGS. 2 and 3) is re-deposition of resputtered conductive material from the magnetic layers 31, 32 and/or the underlying conductive line 22 onto the MTJ 30 at the tunnel barrier layer 34. Such re-deposition may cause a short between the two magnetic layers 31, 32, which need to be electrically insulated from each other across the tunnel barrier layer 34 for the MTJ 30 to work properly. Thus, there is a need for a method to form the MTJ 30 while significantly decreasing or eliminating the risk that electrically conductive materials may be re-deposited onto the MTJ 30 causing a short. Another problem is that re-deposited conductive material may form a bridge between conducting lines, which should be avoided as well.

One method of forming the MTJ 30 that has been tried with the intent of avoiding re-deposition of conductive material onto the MTJ 30 and elsewhere is using a high temperature plasma environment (e.g., 300–400° C.). This method is intended to volatilize the displaced particles so that they are more easily removed from the reaction chamber to avoid re-deposition. A major drawback of this method, however, is the high temperature stress experienced by the device. Such high temperature stress can damage the device and/or negatively affect its performance abilities. Thus, it would be highly desirable to provide a method of forming the MTJ 30 under lower temperature conditions.

Other problems encountered using prior methods of forming an MTJ 30 include corrosion of copper lines and low etch selectivity for TiN hard masks, which are commonly used. Hence, a need exists for a method of forming an MTJ 30 while reducing or preventing corrosion to underlying conducting lines 22 and/or while providing better etch selectivity for the hard mask 42.

BRIEF SUMMARY OF THE INVENTION

The problems and needs outlined above are addressed by embodiments of the present invention. In accordance with one aspect of the present invention, a method of fabricating a magnetic tunnel junction (MTJ) device is provided. This method includes the following steps. A patterned hard mask is oxidized to form a surface oxide thereon. An MTJ stack is etched in alignment with the patterned hard mask after the oxidizing of the patterned hard mask. The hard mask may comprise one or more layers made from titanium, tantalum, tantalum nitride, titanium nitride, titanium oxide, tantalum oxide, or any combination thereof, for example. As one example, the hard mask may include a tantalum nitride layer, a titanium layer over the tantalum nitride layer, and a titanium nitride layer over the titanium layer. The etching of the MTJ stack is preferably performed with an etch chemistry including oxygen and chlorine, and using a self-bias voltage between about −350 and about −380 volts, for example.

In accordance with another aspect of the present invention, a magnetic tunnel junction (MTJ) device is provided, which includes an MTJ stack, a tantalum nitride layer, a titanium layer, and a titanium nitride layer. The tantalum nitride layer is located over the MTJ stack. The titanium layer is located over the tantalum nitride layer. And, the titanium nitride layer is located over the titanium layer.

In accordance with yet another aspect of the present invention, a magnetic tunnel junction (MTJ) device is provided, which includes an MTJ stack, a titanium layer over the MTJ stack, and a titanium nitride layer over the titanium layer.

In accordance with still another aspect of the present invention, a method of fabricating a magnetic tunnel junction (MTJ) device is provided. This method includes the following steps. A hard mask is provided over an MTJ stack. An ARC layer is provided over a hard mask. A patterned photoresist layer is provided over the ARC layer. The ARC layer is etched. Then the hard mask is etched through a first thickness of the hard mask, where the first thickness is less than an entire thickness for the hard mask. The photoresist and ARC layers are stripped after etching through the first thickness of the hard mask. Then, the hard mask is etched through a remaining thickness of the hard mask after removing the photoresist and ARC layers. The hard mask may include a tantalum nitride layer, a titanium layer over the tantalum nitride layer, and a titanium nitride layer over the titanium layer, for example.

In accordance with another aspect of the present invention, a method of fabricating a magnetic tunnel junction (MTJ) device is provided. This method includes the following steps. A hard mask is provided over an MTJ stack. The hard mask includes a titanium nitride layer over a titanium layer. A patterned photoresist layer is provided over the hard mask. The hard mask is etched through a majority of the titanium nitride layer with a first etch recipe. The hard mask is then etched through a remainder of the titanium nitride layer and a first portion of the titanium layer with a second etch recipe. The photoresist layer is then removed. The hard mask may further include a tantalum nitride layer, wherein the titanium layer is over the tantalum nitride layer. After removing the photoresist and ARC layers, the hard mask may be etched through the remainder of the titanium layer and at least a majority of the tantalum nitride cap layer with a third etch recipe. The hard mask may then be oxidized to form a surface oxide thereon.

In accordance with yet another aspect of the present invention, a method of fabricating a magnetic tunnel junction (MTJ) device is provided. In this method, an initial structure is provided, which includes an underlying layer, a bottom tantalum nitride layer over the underlying layer, a tantalum layer over the bottom tantalum nitride layer, an MTJ stack over the tantalum layer, a tantalum nitride cap layer over the MTJ stack, a titanium layer over the tantalum nitride cap layer, a titanium nitride layer over the titanium layer, and a patterned photoresist layer over the titanium nitride layer. Etching through a majority of the titanium nitride layer is performed with a first etch recipe. Etching through a remainder of the titanium nitride layer and a first portion of the titanium layer is performed with a second etch recipe. The photoresist layer is removed. Etching through a remainder of the titanium layer and at least a majority of the tantalum nitride cap layer is performed with a third etch recipe. The titanium nitride layer, the titanium layer, and the tantalum nitride cap layer are oxidized to form a surface oxide thereon. The MTJ stack is etched with a fourth etch recipe. The tantalum layer and the bottom tantalum nitride layer are etched with a fifth etch recipe. Rinsing the structure with de-ionized water may be performed after etching the bottom tantalum nitride layer.

The underlying layer may be an insulating material having a conducting line formed therein. For example, the insulating material may be $SiO_2$, and the conducting line may include a liner layer and a copper line. The MTJ stack may include a platinum manganese layer, a cobalt iron layer over the platinum manganese layer, an aluminum oxide layer over the cobalt iron layer, and a nickel iron layer over aluminum oxide layer, for example. The etching through the majority of the titanium nitride layer preferably goes through about 90% of a total thickness of the titanium nitride layer. The first hard mask etch recipe may include a flow of at least one of $Cl_2$ and $NF_3$. For example, the first etch recipe preferably includes a flow of $Cl_2$ at about 40 sccm, a flow of $NF_3$ at about 4 sccm, a plasma source power of about 2000 watts, a plasma bias power of about 220 watts, and a pressure of about 2.5 mTorr, using a high density M0RI source. The second etch recipe may include a fluorine-based etch chemistry. For example, the second etch recipe preferably includes a flow of $CF_4$ at about 10 sccm, a flow of $CHF_3$ at about 5 sccm, a flow of Ar at about 60 sccm, a plasma source power of about 1000 watts, a plasma bias power of about 100 watts, and a pressure of about 2.5 mTorr. The removing of the photoresist layer may be performed using a flow of $O_2$ or $O_2$ and Ar. The removing of the photoresist layer is preferably performed before the etching with the third etch recipe; however, it may be performed before etching with the second etch recipe or after etching with the third etch recipe. The third etch recipe may include a fluorine-based etch chemistry. For example, the third etch recipe preferably includes a flow of $CF_4$ at about 10 sccm, a flow of $CHF_3$ at about 5 sccm, a flow of Ar at about 60 sccm, a plasma source power of about 1000 watts, a plasma bias power of about 100 watts, and a pressure of about 2.5 mTorr. The oxidizing to form the surface oxide is preferably a plasma oxidation performed under conditions including a flow of $O_2$ at about 50 sccm, a flow of Ar at about 50 sccm, a plasma source power of about 1500 watts, a plasma bias power of about 25 watts, and a pressure of about 5 mTorr, for example. The surface-oxidized titanium nitride, titanium, and tantalum nitride cap layers preferably provide a hard mask structure for the etching of the MTJ stack. The fourth etch recipe may include a flow of $Cl_2$ and $O_2$, or $Cl_2$, $O_2$, and Ar. For example, the fourth etch recipe preferably includes a flow of $Cl_2$ at about 40 sccm, a flow of $O_2$ at about 10 sccm, a flow of Ar at about 20 sccm, a plasma source power of about 2500 watts, a plasma bias power of about 250 watts, a pressure of about 2.5 mTorr, and a self-bias voltage between about −350 and about −380 volts. The fifth etch recipe may include a fluorine-based etch chemistry. For example, the fifth etch recipe preferably includes a flow of $CF_4$ at about 60 sccm, a flow of $O_2$ at about 5 sccm, a flow of Ar at about 10 sccm, a plasma source power of about 1000 watts, a plasma bias power of about 100 watts, a pressure of about 2.5 mTorr, and a self-bias voltage between about −90 and about −110 volts. The underlying layer may be overetched with the fifth etch recipe to remove up to about 90 nm of the underlying layer, as an optional step. The etching of the MTJ stack with the fourth etch recipe may be extended as an overetch for an etch time between 0 and about 1000 seconds to remove redeposited material from sidewalls of the MTJ stack to prevent shorting across a tunnel barrier layer of the MTJ stack. Also, or in alternative, the timing for the etching with the fifth etch recipe may be adjusted to remove redeposited materials from sidewalls of the MTJ stack to prevent shorting across a tunnel barrier layer of the MTJ stack.

In accordance with yet another aspect of the present invention, a method of fabricating a magnetic tunnel junction (MTJ) device is provided. This method includes the process of etching an MTJ stack using an MTJ etch chemistry at a total flow rate, where the total flow rate of the MTJ etch chemistry includes a chlorine flow rate of about 20–60% of the total flow rate, an oxygen flow rate of about 10–40% of the total flow rate, and an argon flow rate of about 20–35% of the total flow rate. For example, the chlorine flow rate may be about 40 sccm, the oxygen flow rate may be about 10 sccm, and the argon flow rate may be about 20 sccm. The process parameters for the etching of the MTJ stack may include a source power of about 2500 watts, a bias power of about 250 watts, a pressure of about 2.5 mTorr, and a self-bias voltage between about −350 and −380 volts, for example.

This method may further include: providing a stack of initial layers over an underlying layer, wherein the stack of initial layers comprises a photoresist layer, an ARC layer, a hard mask, and the MTJ stack, the photoresist being over the ARC, the ARC being over the hard mask, and the hard mask being over the MTJ stack; etching the hard mask to form a hard-mask pattern therein in alignment with a resist pattern formed in the photoresist layer; stripping the photoresist and ARC layers using a resist-strip plasma containing oxygen; and oxidizing exposed surfaces of the hard mask during the stripping of the photoresist layer. The etching of the MTJ stack is preferably performed in a high-density plasma reactor (e.g., M0RI source, TCP, IPS, or ECR). The total flow rate may be between about 50 and about 500 sccm, for example.

In accordance with a further aspect of the present invention, a method of fabricating a magnetic tunnel junction (MTJ) device is provided. This method includes the following steps. A stack of initial layers is provided over an underlying layer. The stack of initial layers includes a photoresist layer, an ARC layer, a hard mask, and an MTJ stack. The photoresist is located over the ARC, the ARC is located over the hard mask, and the hard mask is located over the MTJ stack. The ARC is etched to form a soft-mask pattern therein in alignment with a resist pattern formed in the photoresist layer. The hard mask is etched to form a hard-mask pattern therein in alignment with the ARC pattern formed in the ARC layer. The photoresist and ARC layers are stripped using a resist-strip plasma, which includes oxygen. As the surface of the hard mask is exposed to the plasma, it undergoes plasma oxidation. If needed, the overetch time of the resist-strip plasma may be extended to provide a thicker surface oxide. The MTJ stack is etched in alignment with the hard-mask pattern. The etching of the MTJ stack is performed using an MTJ etch chemistry, wherein the total flow rate of the MTJ etch chemistry includes a chlorine flow rate, an oxygen flow rate, and an argon flow rate. The chlorine flow rate is about 20–60% of the total flow rate, the oxygen flow rate is about 10–40% of the total flow rate, and the argon flow rate is about 20–35% of the total flow rate.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1:
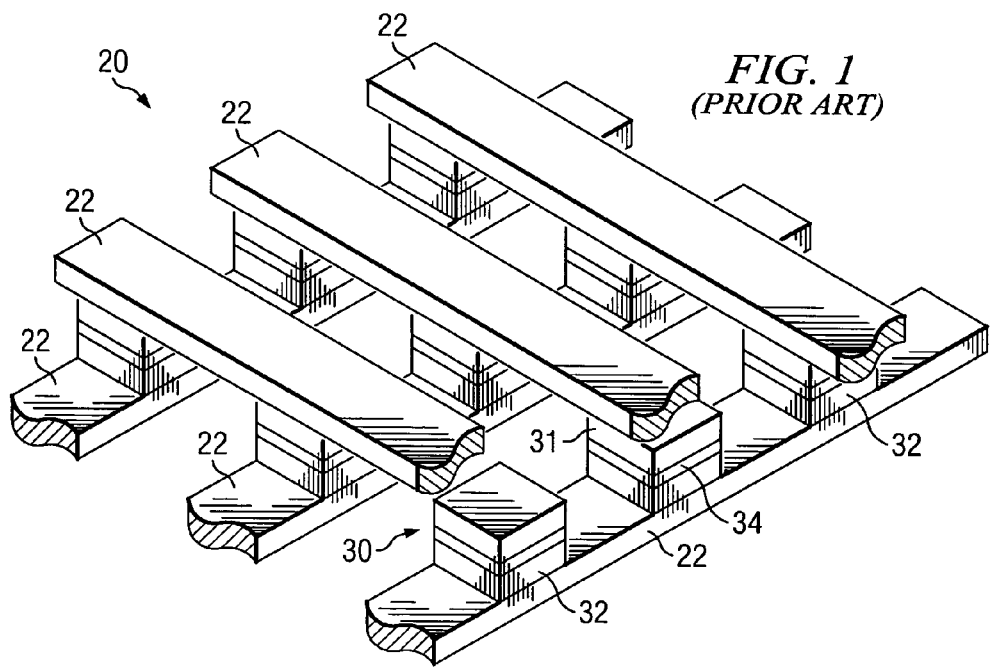
FIG. 1 is a simplified schematic showing a portion of an MRAM device.
Figure 2:
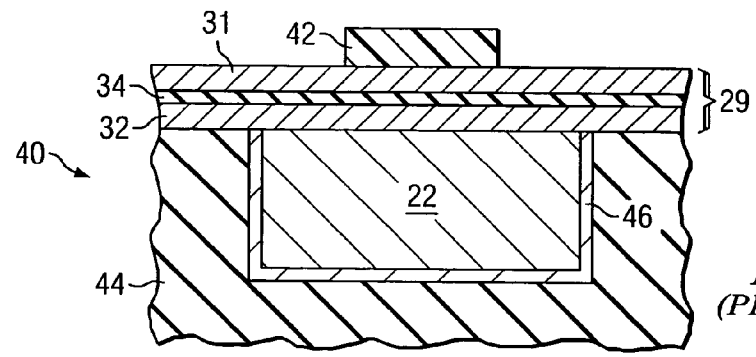
FIGS. 2 and 3 are cross-section views showing fabrication steps in a conventional process of forming an MTJ for an MRAM device.
Figure 3:
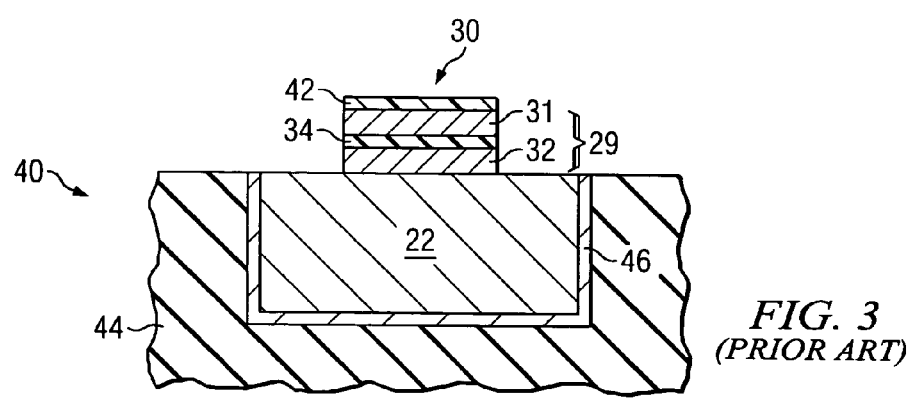

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIGS. 4–15 illustrate a preferred method of fabricating a MTJ 30 for a magnetic tunnel junction device 40 (e.g., an MRAM device) in accordance with a first embodiment of the present invention. FIG. 16 illustrates an optional variation on the first embodiment. FIGS. 17–22 illustrates another method of fabricating a MTJ 30 for a magnetic tunnel junction device 40 in accordance with a second embodiment of the present invention. FIG. 23 illustrates an optional variation on the second embodiment. These methods and their resulting structures 40 will be described next.

Figure 4:
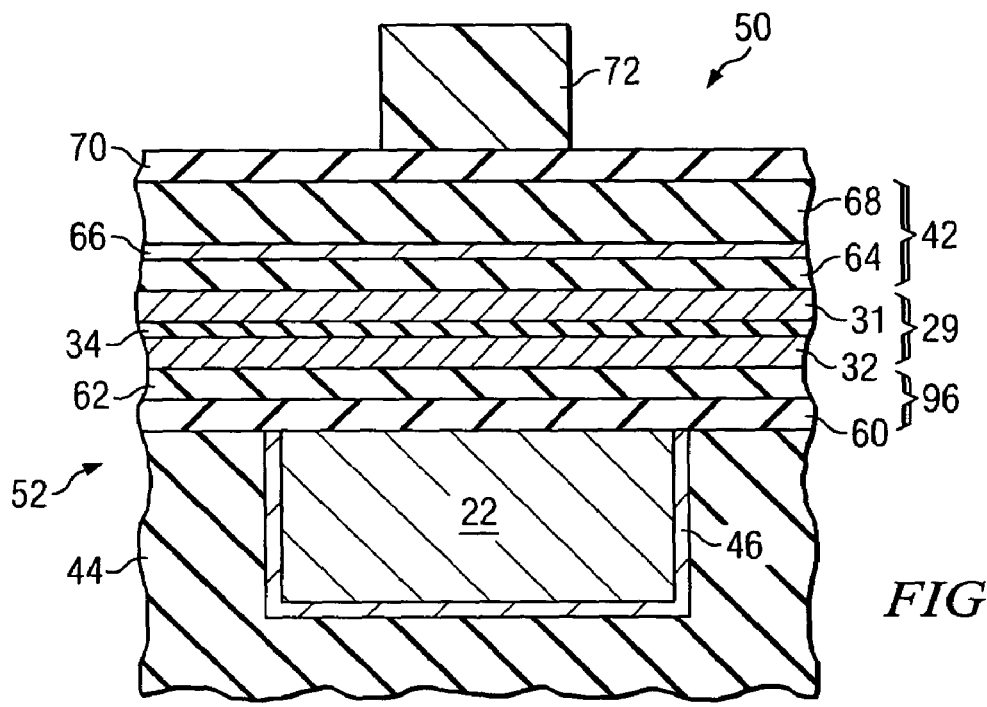
FIGS. 4–12 illustrate a preferred method of fabricating an MTJ for a magnetic tunnel junction device (e.g., an MRAM device) in accordance with a first embodiment of the present invention.

Referring first to FIG. 4, an initial structure 50 is provided. The initial structure 50 includes an underlying layer 52. The underlying layer 52 includes a conducting line 22 formed in a dielectric layer 44, for example. The conducting line 22 may have a liner layer 46, which is typical. The conducting line 22 is preferably made from copper or some copper alloy, for example. However, the conducting line 22 may be made from other conducting materials. The dielectric layer 44 is preferably made from silicon dioxide, for example. However, the dielectric layer 44 may be made from other insulating materials. Due to copper's high diffusivity into $SiO_2$ and its poor adhesion to most dielectric materials, refractory metal-based liners 46 are often used to chemically isolate the copper from the dielectric material. Some example materials that may be used for the liner layer 46 include (but are not limited to) TiN, Ta, $Ta_3N_5$, and $W_2N$, for example.

Still referring to FIG. 4, the initial structure 50 of the first embodiment includes a bottom tantalum nitride layer 60 over the underlying layer 52. A tantalum layer 62 is over the bottom tantalum nitride layer 60. An MTJ stack 29 is over the tantalum layer 62. A tantalum nitride cap layer 64 is over the MTJ stack 29. A titanium layer 66 is over the tantalum nitride cap layer 64. A titanium nitride layer 68 is over the titanium layer 66. An anti-reflective coating (ARC) layer 70 is over the titanium nitride layer 68. A patterned photoresist layer 72 is over the ARC layer 70. The photoresist layer 72 may be patterned using conventional methods, for example.

Tables 1 and 2 below provide illustrative process parameters that may be used for an embodiment of the present invention. Table 1 provides some preferred process parameters and conditions that may be used. The values provided in Table 1 are merely illustrative and these values may be varied thereabout to also provide preferred results. The ranges and values provided in Table 2 provide broader and possibly acceptable ranges for the process parameters. The values provided in Table 1 have been tested and verified to work well, whereas the ranges and values provided in Table 2 are estimated ranges that have not necessarily been tested and verified through experimentation.

Referring to Table 1, these preferred process parameters were developed using a Pinnacle 8000 high density plasma source (manufactured by Trikon Technologies). This tool used in experimentation has two etch chambers, both having M0RI sources. One chamber may be dedicated to dielectric material etching and the other chamber may be dedicated to metal etching, for example. However, a process of the present invention may be practiced in other types of plasma sources as well, including but not limited to ECR sources, IPS sources, TCP sources, and/or parallel plate diode sources, for example.

Figure 5:
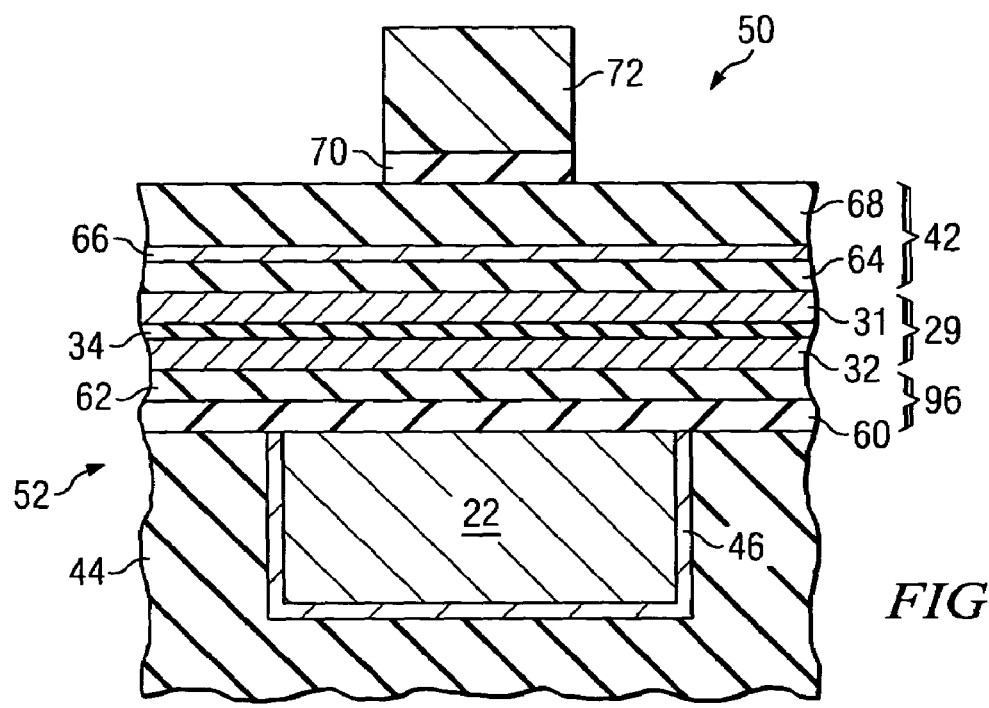
Figure 6:
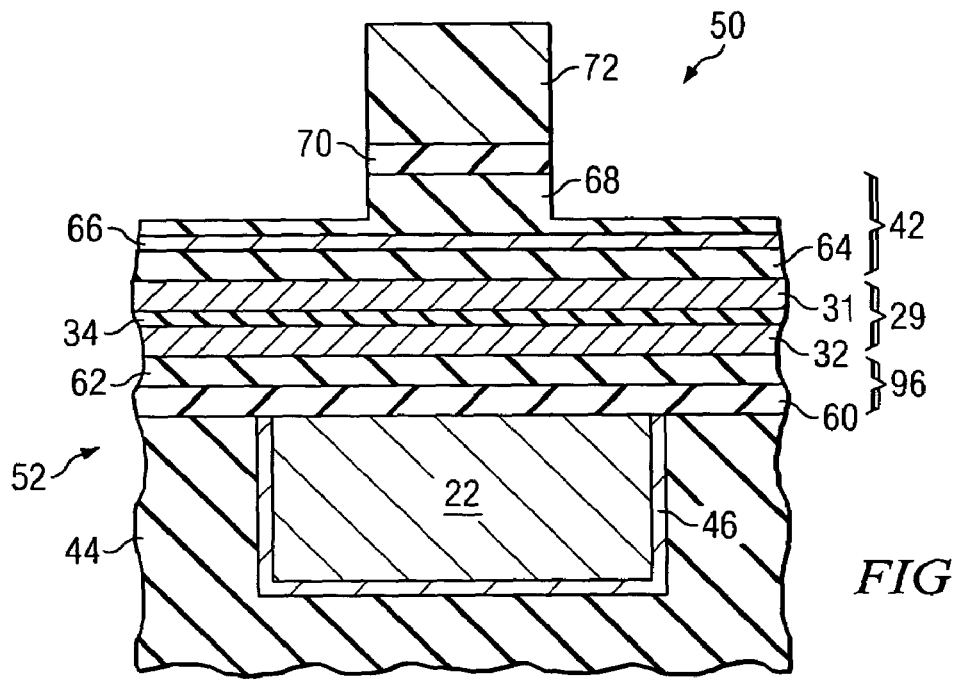

Referring to FIG. 5, the ARC layer 70 is opened in alignment with the patterned photoresist layer 72. Next, as shown in FIG. 6, a majority of the titanium nitride layer 68 is etched using a first etch recipe, which includes a chlorine-based etch chemistry. The preferred parameters for the first etch recipe are shown under step #2 on Table 1. Preferably, about 90% of a total thickness of the titanium nitride layer 68 is etched using the first etch recipe. One of the goals of this etch using the first etch recipe is to provide vertical or nearly vertical side walls for the patterned titanium nitride layer 68. The first etch recipe works well to etch the titanium nitride layer 68 quickly while providing the desired vertical or near vertical sidewalls. However, the etch selectivity between the titanium nitride layer 68 and the titanium layer 66 (or between the titanium nitride layer 68 and the tantalum nitride layer 64 when no titanium layer 66 is present therebetween) may be insufficient to provide a precisely controlled etch stop.

Figure 7:
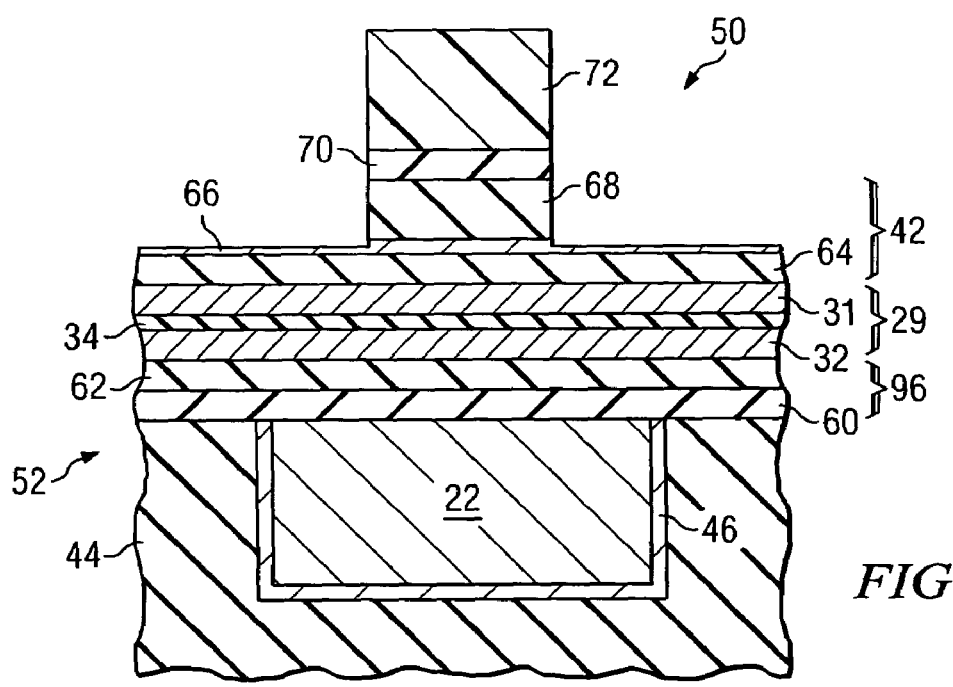

Switching to a second etch recipe, which includes a fluorine-based etch chemistry, the remainder of the titanium nitride layer 68 is etched with a soft landing in the titanium layer 66, as shown in FIG. 7. The preferred parameters for the second etch recipe are shown under step #3 on Table 1. Using the second etch recipe, the titanium nitride layer 68 etches at a rate about three times faster than the etch rate for the titanium layer 66. Hence, a good etch selectivity (about 3:1) is provided between the titanium nitride layer 68 and the titanium layer 66 with the second etch recipe. With this good etch selectivity, the titanium layer 66 may be relatively thin with a thickness on the order of about 100 angstroms, for example. Even though the titanium layer 66 may be relatively thin, the etch selectivity between the titanium nitride layer 68 and the titanium layer 66 is sufficient to provide an etch stop. The use of an etch stop layer when etching the titanium nitride layer 68 is desired to avoid exposure of the tantalum nitride cap layer 64 at this stage. It may be desirable to avoid completely etching the tantalum nitride cap layer 64 at this stage while the photoresist layer 72 is still present to prevent problems with "fencing," which is discussed below.

TABLE 1

An illustrative process flow of the first embodiment with preferred conditions.

| Step # | Recipe Purpose | Gas Mix (sccm) Preferred | Source/Bias Powers (watts) Preferred | Self-bias Voltage (Vpp) | Pressure (mT) Preferred | Coils Inner/Outer (amps) Preferred | Etch Time (sec) Preferred | Recommended Etch Chamber |
|---|---|---|---|---|---|---|---|---|
| 1 | ARC Open | 10 CF$_4$ 5 CHF$_3$ 60 Ar | 1000/100 | | 2.5 | 25/25 | optical emission spectroscopy end point (OES EP) | Dedicated Dielectric |
| 2 | TiN Mask Main Etch | 40 Cl$_2$ 4 NF$_3$ | 2000/220 | | 2.5 | 30/0 | 43 | Dedicated Metal |
| 3 | Soft Landing of TiN Mask on Ti Layer | 10 CF$_4$ 5 CHF$_3$ 60 Ar | 1000/100 | | 2.5 | 25/25 | OES EP | Dedicated Dielectric |
| 4 | Resist and ARC Strip | 50 O$_2$ 50 Ar | 1500/25 | | 5 | 25/25 | 120 | Dedicated Dielectric |
| 5 | Ti and TaN Cap Etch | 10 CF$_4$ 5 CHF$_3$ 60 Ar | 1000/100 | | 2.5 | 25/25 | End point detection using residual gas analysis of a nitrogen peak or OES EP | Dedicated Dielectric |
| 6 | Plasma Oxidation of Hard Mask | 50 O$_2$ 50 Ar | 1500/25 | | 5 | 25/25 | 120 | Dedicated Dielectric |
| 7 | MTJ Stack Etch | 40 Cl$_2$ 10 O$_2$ 20 Ar | 2500/250 | −350 to −380 | 2.5 | 50/50 | 72 | Dedicated Metal |
| 8 | MTJ Cleanup and Stop Layer Etch | 60 CF$_4$ 5 O$_2$ 10 Ar | 1000/100 | −90 to −110 | 2.5 | 25/25 | 40 | Dedicated Dielectric |

TABLE 2

An illustrative process flow of the first embodiment with acceptable condition ranges.

| Step # | Recipe Purpose | Gas Mix (sccm) Acceptable | Source/Bias Powers (watts) Acceptable | Pressure (mT) Acceptable | Coils Inner/Outer (amps) Acceptable | Etch Time (sec) Acceptable |
|---|---|---|---|---|---|---|
| 1 | ARC Open | $CF_4$ = (1–500)<br>$CHF_3$ = (1–500)<br>Ar = (1–1000) | (0–3000)/<br>(0–3000) | 0.1–500 | (0–200)/<br>(0–200) | 5–500 |
| 2 | TiN Mask Main Etch | $Cl_2$ = (1–500)<br>$NF_3$ = (0–500) | (0–3000)/<br>(0–3000) | 0.1–500 | (0–200)/<br>(0–200) | 1–1200 |
| 3 | Soft Landing of TiN Mask on Ti Layer | $CF_4$ = (1–500)<br>$CHF_3$ = (1–500)<br>Ar = (0–1000) | (0–3000)/<br>(0–3000) | 0.1–500 | (0–200)/<br>(0–200) | 0–1200 |
| 4 | Resist and ARC Strip | $O_2$ = (1–1000)<br>Ar = (0–1000) | (0–3000)/<br>(0–3000) | 0.1–1000 | (0–200)/<br>(0–200) | 1–1200 |
| 5 | Ti and TaN Cap Etch | $CF_4$ = (1–500)<br>$CHF_3$ = (1–500)<br>Ar = (0–1000) | (0–3000)/<br>(0–3000) | 0.1–500 | (0–200)/<br>(0–200) | 1–1200 |
| 6 | Plasma Oxidation of Hard Mask | $O_2$ = (1–1000)<br>Ar = (0–1000) | (0–3000)/<br>(0–3000) | 0.1–1000 | (0–200)/<br>(0–200) | 1–1200 |
| 7 | MTJ Stack Etch | $Cl_2$ = (1–500)<br>$O_2$ = (1–500)<br>Ar = (0–1000) | (0–3000)/<br>(0–3000) | 0.1–1000 | (0–200)/<br>(0–200) | 1–1200 |
| 8 | MTJ Cleanup and Stop Layer Etch | $CF_4$ = (1–500)<br>$O_2$ = (1–500)<br>Ar = (1–1000) | (0–3000)/<br>(0–3000) | 0.1–1000 | (0–200)/<br>(0–200) | 1–1200 |

Figure 8:
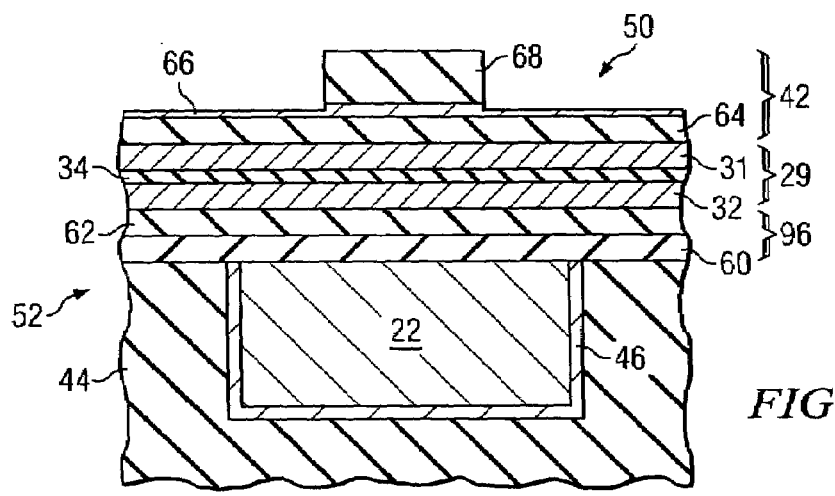

Referring to FIG. 8, preferably the photoresist layer 72 and the ARC layer 70 are stripped before etching the tantalum nitride cap layer 64. The preferred parameters for this stripping step are shown under step #4 on Table 1. It is preferable to strip the photoresist as soon as possible (i.e., as soon as a sufficient amount of the hard mask 42 is patterned) to prevent "fencing" problems. "Fencing" refers to a build-up of material (e.g., hard mask material, cap layer material, low volatility MTJ stack materials, or any combination thereof) along the sidewalls of the photoresist 72 (resulting from redeposition of displaced material) that is not removed during the photoresist strip to leave behind a fence-shaped structure (not shown) around the former location of the patterned photoresist layer 72. One of the primary causes of fencing is when the MTJ stack 29 is exposed and/or etched prior to removing the photoresist layer 72. This may occur, for example, when there is insufficient precision in the etch stop before reaching the MTJ stack 29 while opening the hard mask 42. Such fence structures are also sometimes referred to as a veil. The development of such fence structures is usually undesired. Thus, by interrupting the hard mask etching to remove the photoresist layer 72 and/or by providing an etch stop layer to prevent exposure of the MTJ stack to the plasma before removing the photoresist layer 72, the fencing problem may be reduced or eliminated.

In other embodiments, the titanium layer 66 may be deleted. However, the etch selectivity between titanium nitride and tantalum nitride may not be great enough to consistently stop at or within the tantalum nitride layer 64 to allow the insertion of the photoresist strip (to prevent fencing). In a preferred embodiment of the present invention, regardless of the number of layers or materials used for the hard mask 42 of the MTJ 30, the photoresist 72 is stripped after only a portion of the hard mask 42 is patterned. Then, the remainder of the hard mask 42 may be etched in alignment with the already-patterned portion of the hard mask 42 in order to reduce or eliminate fencing. The hard mask 42 in the first embodiment shown in FIGS. 4–12 includes the titanium nitride layer 68, the titanium layer 66, and the tantalum nitride cap layer 64. In other embodiments, the hard mask 42 may have one or more layers which may be made from (but is not limited to) titanium, tantalum, a titanium-based compound, a tantalum-based compound, or any combination thereof, (e.g., TiN, TaN, Ti, TiO, Ta, $Ta_2O_5$), for example.

If a layer (e.g., titanium layer 66) is not present for providing an etch stop during the hard mask etching, a timed etch process may be used to stop during the hard mask etching for performing the photoresist strip. However, if the parameters or conditions change slightly during repeated processing (e.g., during mass production manufacturing), the remaining thickness of the hard mask 42 may vary. Such variance in the remaining hard mask thickness after performing the photoresist strip may cause further propagated errors or drift in subsequent steps, which may negatively affect the product yield. Thus, the use of an etch stop layer in accordance with an embodiment of the present invention may greatly improve process reliability and repeatability while addressing fencing problems, which may in turn provide higher yield.

Note in Table 1, step #4, that the photoresist strip recipe may include the use of oxygen and argon in a plasma environment. In such environment, the exposed surfaces of the hard mask may begin to form a surface oxide.

The tantalum nitride cap layer 64 serves numerous purposes. One purpose is providing a cap layer over the MTJ stack 29 to protect it if or when the wafer is exposed to an environment that may corrode the MTJ stack materials. Another purpose is to prevent diffusion of the metal materials in the MTJ stack 29 to other surrounding layers. Yet another purpose is to provide part of the hard mask 42.

Figure 9:
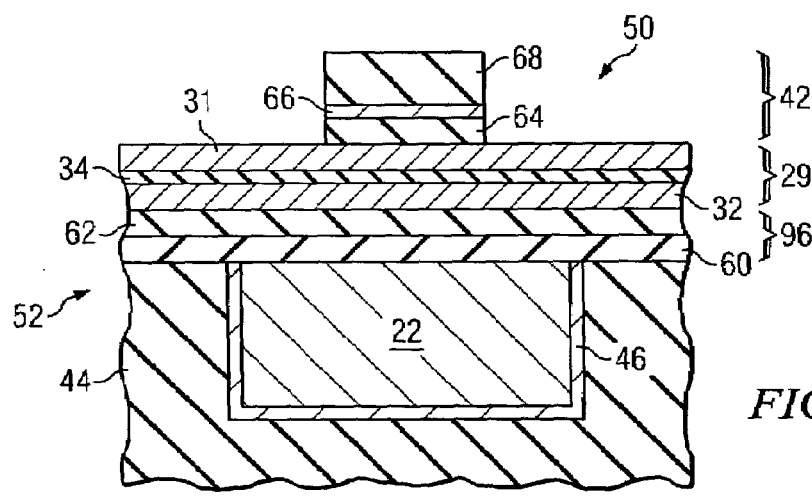

Referring to FIG. 9, with the photoresist layer 72 and ARC layer 70 stripped, the remainder of the titanium layer 66 and most or all of the total thickness for the tantalum nitride cap layer 64 is etched using a third etch recipe. The preferred parameters for the third etch recipe are shown under step #5 on Table 1. Preferably, the third etch recipe is the same as the second etch recipe. In other embodiments, however, the third etch recipe may differ from the second etch recipe. For example, the third etch recipe may use a chlorine-based etch chemistry, or a combination of a fluorine-based gas and a chlorine-based gas as a mixture, for example.

Figure 10:
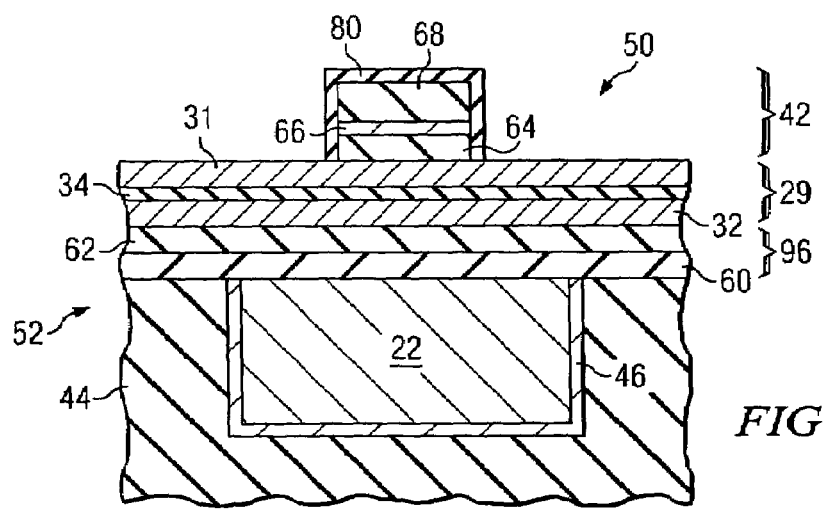

With the hard mask 42 patterned, as shown in FIG. 9, the hard mask 42 is now oxidized (e.g., in a plasma oxidation process). The oxidation process causes the formation of a surface oxide 80 on the hard mask layers 42, as shown in FIG. 10. The preferred parameters for the plasma oxidation are shown under step #6 on Table 1. The energy provided by the accelerated argon breaks chemical bonds and promotes the formation of the surface oxide 80 on the hard mask layers 42. Also, the argon pushes or knocks oxygen deeper into the surface of the hard mask 42 to enhance the thickness of the surface oxide 80. As will be discussed further below, this surface oxide formation on the hard mask layers 42 plays a key role in improving the hard mask's resistance to being etched away during the etching of the MTJ stack layers 29 and extends the life of the hard mask 42. This improved resistance to being etched allows for the use of a thinner hard mask 42 (e.g., less than 1000 Å) than would be used without the benefit of the surface oxidation 80.

Figure 11:
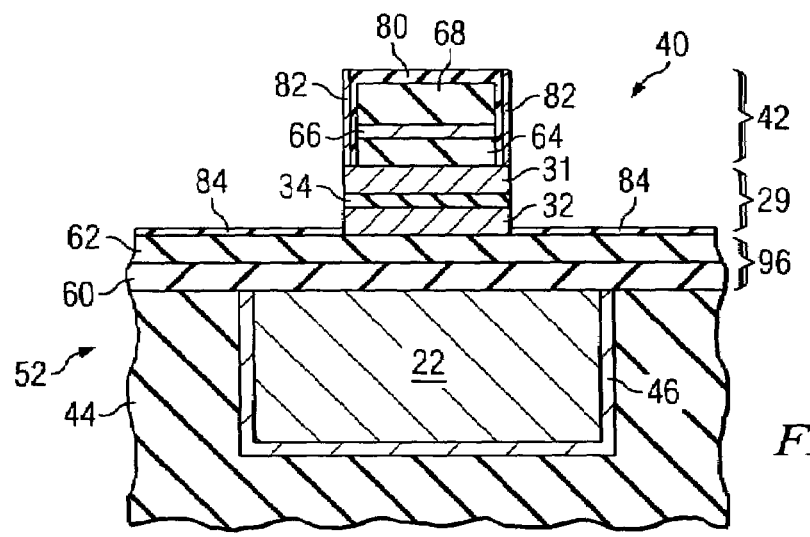

As shown in FIG. 11, after forming the surface oxide 80 on the hard mask layers 42, the MTJ stack 29 is etched using a fourth etch recipe. The fourth etch recipe may also be used to oxidize the hard mask 42 in alternative to or in addition to the plasma oxidation step (e.g., step #6 on Table 1). The preferred parameters for the fourth etch recipe are shown under step #7 on Table 1. The MTJ stack 29 of a currently preferred embodiment includes a platinum manganese layer, a cobalt iron layer, an aluminum oxide layer, and a nickel iron layer. In such preferred embodiment, the cobalt iron layer is over the platinum manganese layer to form a lower magnetic layer, the nickel iron layer acts as an upper magnetic layer, and the aluminum oxide layer provides the tunnel barrier layer between the magnetic layers. As will be apparent to one of ordinary skill in the art, there are many possible material choices and layer configurations possible for providing an MTJ stack 29, any of which may be incorporated into an embodiment of the present invention.

Figure 13:
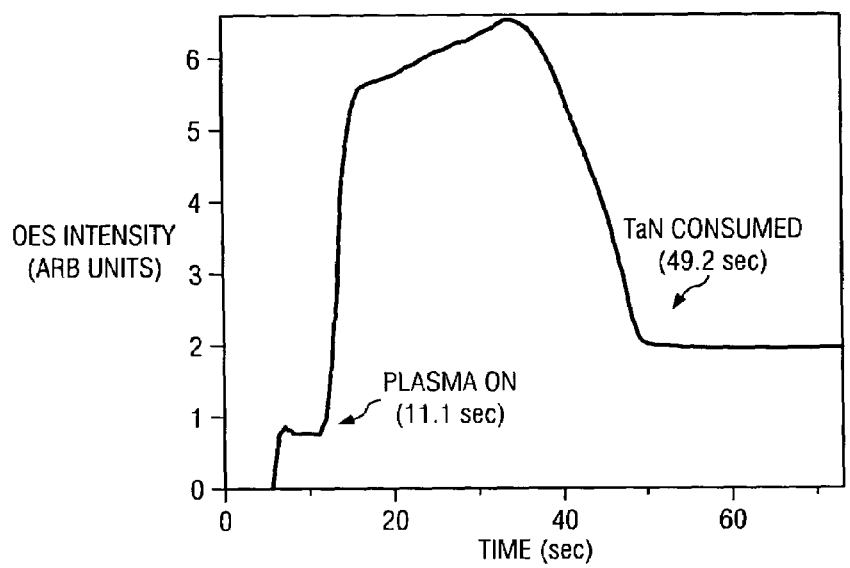
FIGS. 13–15 are graphs of data from experiments implementing steps of the present invention.
Figure 14:
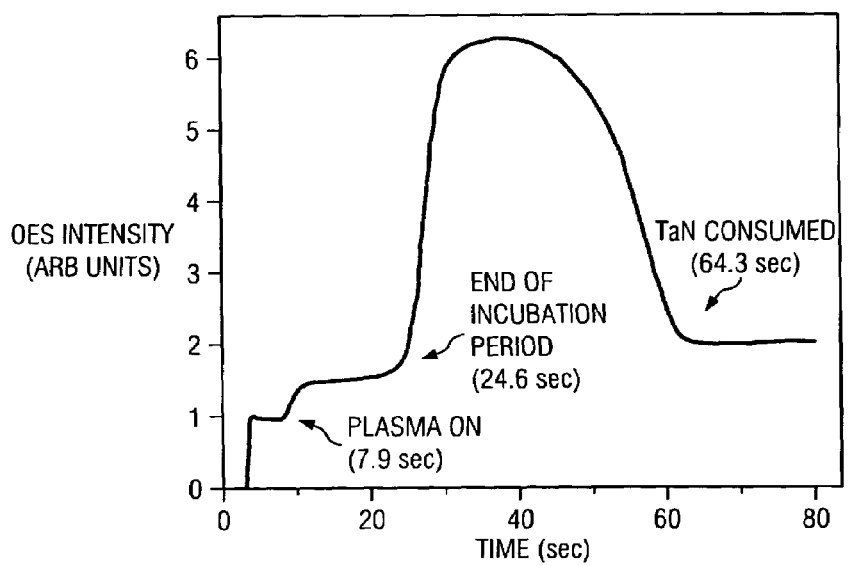

Preferably, the MTJ stack etch is performed under low pressure (e.g., about 2.5 mTorr) with a high self-bias voltage (e.g., about −350 to −380 V) using a $Cl_2/O_2/Ar$ gas mix. The addition of $O_2$ gas in the fourth etch recipe provides the advantage of enhanced etch resistance for the hard mask 42 and etch stop layers 60, 62. FIGS. 13 and 14 show graphs of data from a comparison test using optical emission spectroscopy (OES). Each graph plots OES signal intensity (in arbitrary units) versus time under separate etch processes performed on identical films.

To provide the data graphed in FIG. 13, a 50 nm thick blanket film of tantalum nitride is etched. The fourth etch recipe (MTJ stack etch recipe) shown as step #7 in Table 1 was used to etch the tantalum nitride layer, except that the oxygen gas flow was removed from the etch recipe. Under these circumstances, the etch rate for the tantalum nitride layer was about 13.1 Å/sec and the etch time for consuming the tantalum nitride layer was about 38.1 seconds (from the time that the plasma was turned on). In comparison, an identical blanket tantalum nitride layer (50 nm thick) was initially exposed to the fourth etch recipe (MTJ stack etch recipe) shown as step #7 in Table 1 for about 698 seconds. During this initial exposure, the tantalum nitride layer was not consumed, and it instead induced the formation of a surface oxide on the tantalum nitride layer. The same tantalum nitride layer that was exposed to the fourth etch recipe for 698 seconds was then put through another test, the results of which are shown in FIG. 14. In the test that generated the results shown in FIG. 14, the tantalum nitride layer was exposed to the etch recipe (MTJ stack etch recipe) shown as step #7 in Table 1, but without the $O_2$ flow, as was performed in the test for FIG. 13. Referring to FIG. 14, note that after the plasma is turned on, an incubation period of about 16.7 seconds occurs before the tantalum nitride layer begins to be consumed by the etch recipe. After the etching (i.e., consumption) begins (i.e., after the incubation period), the time required to consume the remainder of the tantalum nitride layer is about 39.7 seconds (see FIG. 14), which is comparable to the total etch time needed to consume the first tantalum nitride layer (see first test of FIG. 13). This incubation period is attributable to the formation of the surface oxide on the tantalum nitride layer. It is believed that this initial etch resistance (during the 698 second period with the $O_2$-included etch chemistry of step #7 in Table 1) is achieve because of the surface oxidation layer formed atop the tantalum nitride layer. As oxygen is broken away or sputtered away from this oxide layer during this $O_2$-included etch, some of the lost oxygen is immediately replenished by the oxygen present in the etch recipe. Also, the surface oxide provides a hardening of the hard mask's surface due to its higher etch resistance than tantalum nitride. With such a high self-bias potential (e.g., about −360 V) used in the preferred fourth etch recipe (see Table 1), one may expect a lot of sputtering to occur due to the high impact energy of the Ar+ and Cl+ ions. Yet, it exhibits a very high etch resistance during this period. Although these tests for providing FIGS. 13 and 14 were performed using a tantalum nitride film, it is anticipated that other layers made from titanium- or tantalum-based compounds may behave similarly due to the ability to form similar surface oxides on such materials. Hence, the formation of a surface oxide on such materials (i.e., titanium- and/or tantalum-based compounds) and then etching with a chlorine-based etch chemistry including oxygen provides a method of semiconductor fabrication in accordance with an embodiment of the present invention.

The addition of oxygen to the fourth etch recipe for the MTJ stack etch does not significantly affect the etch rate of the MTJ stack 29, but as shown in FIGS. 13 and 14, it has a significant affect on the etch rate of the oxidized hard mask. This provides for an improved etch selectivity between the MTJ stack 29 and the hard mask 42, and allows for the use of a relatively thinner hard mask 42.

Figure 12:
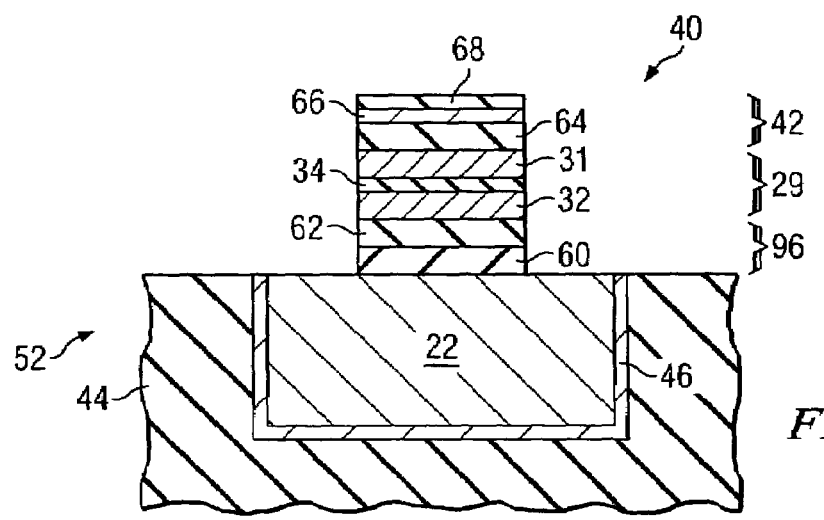

Because the MTJ stack materials typically have a low volatility and typically do not vaporize into gas molecules during the etching process, a crust 82 or layer of displaced material from the MTJ stack 29 may form on the sidewalls of the hard mask 42, as shown in FIG. 11. Typically, etching of non-volatile material near a wall will cause the wall to be coated very quickly. During an overetch portion of the MTJ stack etch and/or a subsequent MTJ stack cleanup etch using a fifth etch recipe (see e.g., step #8 in Table 1), some or all of the redeposited MTJ stack material crust 82 may be removed from the sidewalls of the hard mask 42, as shown in FIG. 12. However, there may not be any harm to the performance of the MTJ 30 in leaving some or all of the crust 82 on the sidewalls of the hard mask 42.

Figure 24:
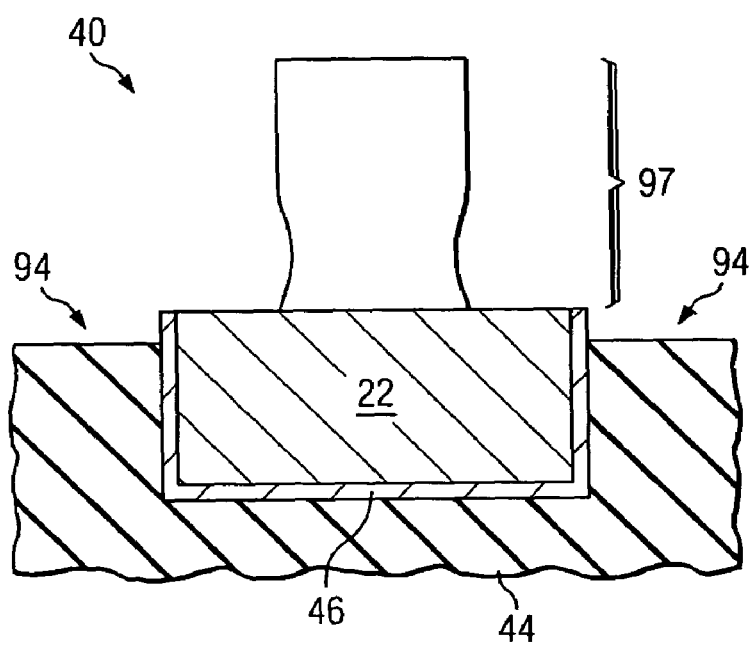
FIG. 24 illustrates an optional overetch or slight lateral etch of the stack.

With an overetch using the MTJ stack etch (e.g., step #7 in Table 1) and/or a subsequent MTJ stack cleanup etch using a fifth etch recipe (e.g., step #8 in Table 1), a lateral etch of the MTJ stack may be achieved, as shown in FIG. 24, for example. Such a lateral etch may cause a slight hourglass shape for the side profile of the MTJ stack (or bowed sidewalls) (see e.g., FIG. 24), as has been experienced during experimentations by the inventors. Such lateral etch may be highly desirable to ensure that excess MTJ stack material, for example, that may have been sputtered back onto the sidewalls of the MTJ stack is removed to prevent shorting across the tunnel barrier layer of the MTJ stack. One of the primary concerns during the fabrication of an MTJ stack is preventing a short across the tunnel barrier layer to ensure that the MTJ will function properly. The use of the Ta/TaN etch stop layers 96 may attribute to the ability to perform a lateral overetch/cleanup etch of the MTJ stack. Also, the etch resistance of the hard mask 42 under certain $O_2$-included etch chemistries (e.g., as discussed above) may attribute to the ability to perform an overetch or slight lateral etch on the MTJ stack to provide a structure 97, as shown in FIG. 24. An overetch of or later etch of the MTJ stack may be tuned to provide different amounts of bowing (i.e., lateral removal of material). Also, the bowing effect may or may not extend into the hard mask layers and/or other layers surrounding the MTJ stack. The insulating layer 44 may be overetched (see region 94 in FIG. 24) during the formation of the structure 97 shown in FIG. 24. The amount of overetching into the insulating layer 44, if any, may differ from that shown in FIG. 24.

With the combination of the incubation period for the oxidized hard mask 42 (see FIG. 14) and the buildup of the MTJ stack material crust 82 on the sidewalls of the hard mask 42, the critical dimensions of the MTJ formation are maintained well using an embodiment of the present invention. Also, the sides of the hard mask 42 are preserved through most or all of the MTJ stack etch. The crust 82 of MTJ stack material on the sidewalls of the hard mask 42 may protect its edges from faceting (i.e., wearing the hard mask 42 laterally at its edges).

The MTJ stack etch may be stopped just before, on, or just within the tantalum layer 62. The use of oxygen within the MTJ stack etch contributes to the ability to stop at the tantalum layer 62. As shown in FIG. 11, a surface oxide 84 may develop on the tantalum layer 62 as it is opened using the fourth etch recipe, due to the presence of oxygen in the etch recipe.

Using an embodiment of the present invention may also provide the ability to detect the endpoint for the MTJ stack etch with a conventional endpoint control function/tool. Some example endpoint detection methods that may be used in an embodiment of the present invention include, but are not limited to: residual gas analysis, optical emission spectroscopy, and/or interferometric endpoint techniques, for example. Often when etching an MTJ stack 29, it is difficult or impossible to use an endpoint control function to detect the stopping point for an MTJ stack etch. This inability to detect the endpoint is often caused by the etch rate being too slow and not throwing off enough atoms per unit time to affect the color and/or brightness of the plasma. Thus, it is significant that an embodiment of the present invention provides the ability to detect the endpoint. Endpoint detection is usually highly preferred over a timed etch process, due to the possibility of process drift while using a timed etch. Timed etching is riskier because if conditions drift in the chamber and the etch is not consistent, a full lot of wafers may be lost (e.g., if it is not etched long enough).

Figure 15:
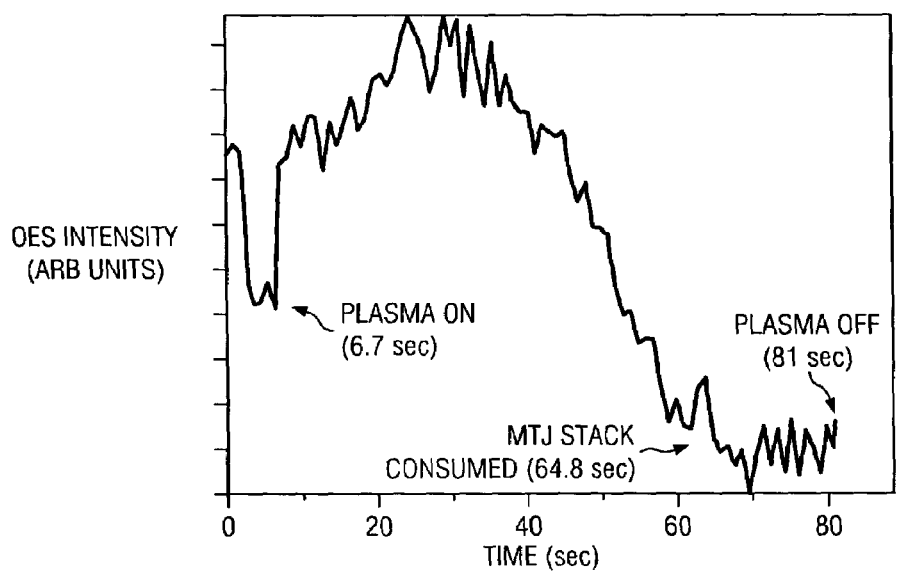
Figure 16:
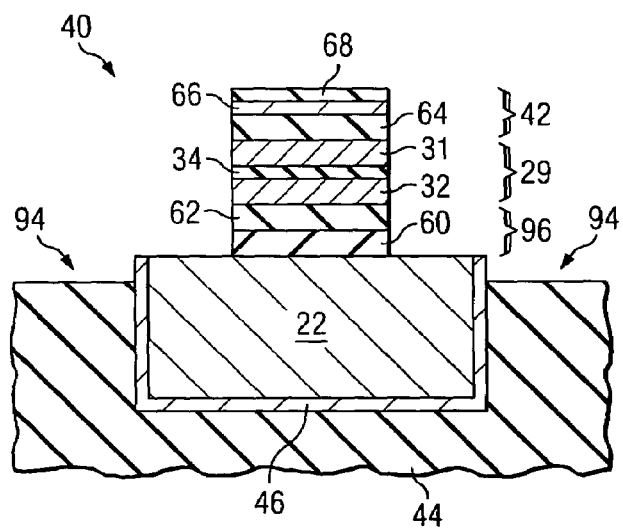
FIG. 16 illustrates an optional variation on the first embodiment.

The graph in FIG. 15 illustrates a demonstration that the endpoint may be detected for an MTJ stack etch performed in accordance with an embodiment of the present invention. Using optical emission spectroscopy, the data graphed in FIG. 15 shows the etch end point at the knee of the data plot at about 64.8 seconds. The intensity displayed in this data comprised the sum of light intensities detected in the wavelength bands of about 302–310 nm and about 339–346 nm, for example. This ability to detect the etch end point may be attributable (at least in part) to the use of a high density plasma source (e.g., M0RI source). Also, the presence of the tantalum layer 62 below the MTJ stack 29 acts as an excellent etch stop due to the use of oxygen in the MTJ stack etch recipe (as discussed above).

The tantalum layer 62 and the bottom tantalum nitride layer 60 provide numerous purposes. One purpose is to provide a cap layer or barrier layer over the conducting line 22 (which is typically copper). Another purpose is to provide better adhesion between its adjacent layers. Still another purpose is to provide an etch stop layer in an embodiment of the present invention. Other combinations and/or number of layers may be used here in alternative to the tantalum layer 62 and/or the bottom tantalum nitride layer 60, such as (but not necessarily limited to) titanium- and/or tantalum-based materials. Yet another purpose is to prevent copper conducting lines 22 from being exposed to chlorine during the MTJ stack etch, which could corrode the copper.

Referring to FIG. 12, for an ideal process flow of the present invention, the thickness of the tantalum layer 62 and the bottom tantalum nitride layer 60 may be tuned such that the clean up etch for the cleaning up the sidewalls of the MTJ stack 29 with a fifth etch recipe also completely etches these layers 60, 62. The preferred parameters for the fifth etch recipe are shown under step #8 on Table 1. But in other embodiments, the MTJ stack cleanup etch may be a separate etch step using a different etch recipe than the etch step for opening the tantalum layer 62 and/or the bottom tantalum nitride layer 60. The fifth etch recipe may include the use of a gas mixture of $CF_4$, $CHF_3$, and Ar, for example. Also, in other embodiments, an overetch by several 10's of nanometers into the insulator 44 may be performed, as shown in FIG. 16 for example, which may result in an overetched region 94 in the insulating substrate 44 (as an optional step/feature). Such over etching 94 in the insulating layer 44 may be preferred in a timed etch process to ensure that there are no shorts between conducting lines 22, for example.

During testing using the first embodiment of the present invention, it was found that the bottom tantalum nitride layer 60 has an average etch rate of about 2.4 Å/sec, for example. Based on this etch rate, the thickness of the Ta/TaN stop layer 96 may be adjusted and tuned to allow it to be etched during the MTJ clean up etch (using the fifth etch recipe). Based on an etch rate of about 2.4 Å/sec, it follows that a combined Ta/TaN stop layer thickness between about 100–200 Å may be acceptable. However, the combined Ta/TaN stop layer thickness may range between about 10–800 Å to provide a window of practical thickness, for example.

One of the purposes of the MTJ stack cleanup etch using a fifth etch recipe that includes a fluorine-based etch chemistry is to eliminate chlorine residuals from the etch chamber before exposing copper conducting lines 22. Another purpose is to cleanup the MTJ stack side walls. One of the primary concerns in forming an MTJ 30 is preventing a short across the tunnel barrier layer in the MTJ stack 29, which could hinder or prevent that MTJ 30 from working and performing its intended purpose.

In a preferred embodiment, a deionized water rinse is performed after the etch with the fifth etch recipe. Because some fluorine-based etch residuals are water soluble, this water rinse step may be used to clean off residues from the last etch step to provide a clean, residue-free structure 40. In other embodiments, however, such water rinse step may not be needed or desired.

Figure 17:
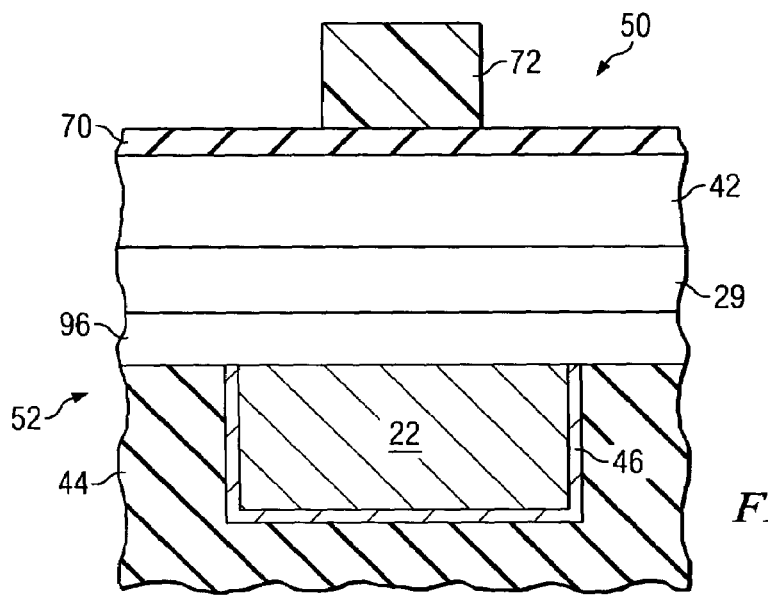
FIGS. 17–22 illustrates another method of fabricating an MTJ for a magnetic tunnel junction device in accordance with a second embodiment of the present invention.

FIGS. 17–22 illustrates another method of fabricating a MTJ 30 for a magnetic tunnel junction device 40 in accordance with a second embodiment of the present invention. FIG. 17 shows an initial structure 50, which includes an underlying layer 52. The underlying layer 52 includes a conducting line 22 formed in a dielectric layer 44, for example. The conducting line 22 may have a liner layer 46, which is typical. The initial structure 50 of the second embodiment includes a bottom etch-stop/barrier layer 96 over the underlying layer 52. An MTJ stack 29 is over the bottom layer 96. A hard mask 42 is over the MTJ stack 29. An anti-reflective coating (ARC) layer 70 is over the hard mask 42. A patterned photoresist layer 72 is over the ARC layer 70. The photoresist layer 72 may be patterned using conventional methods, for example.

For purposes of simplification and illustration, the hard mask 42 is shown in FIGS. 17–23 as a single layer, even though it may include one or more layers of one or more materials (as discussed above regarding the first embodiment). Likewise, the MTJ stack layer 29 is shown in FIGS. 17–23 as a single layer, even though it includes three or more layers of several different materials (as discussed above). Furthermore, the bottom layer 96 is shown as a single layer, even though it may include one or more layers of one or more materials (as discussed above regarding the first embodiment).

Figure 18:
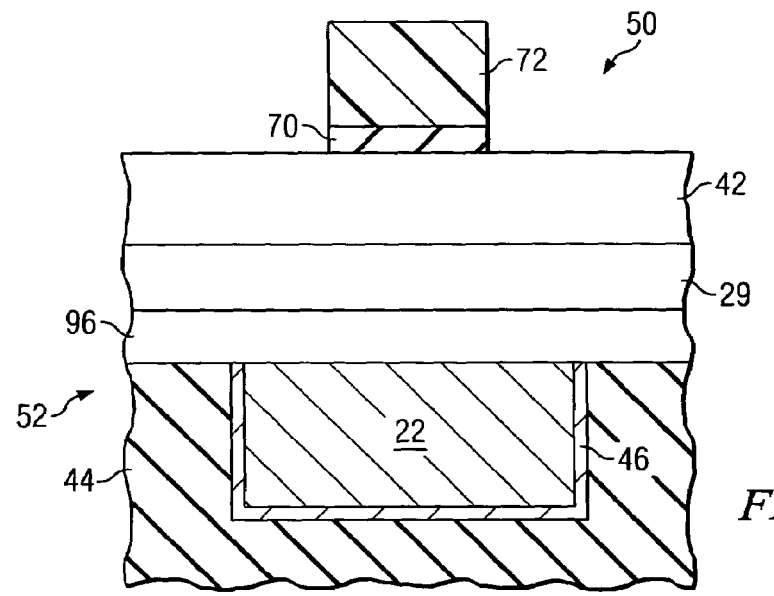
Figure 19:
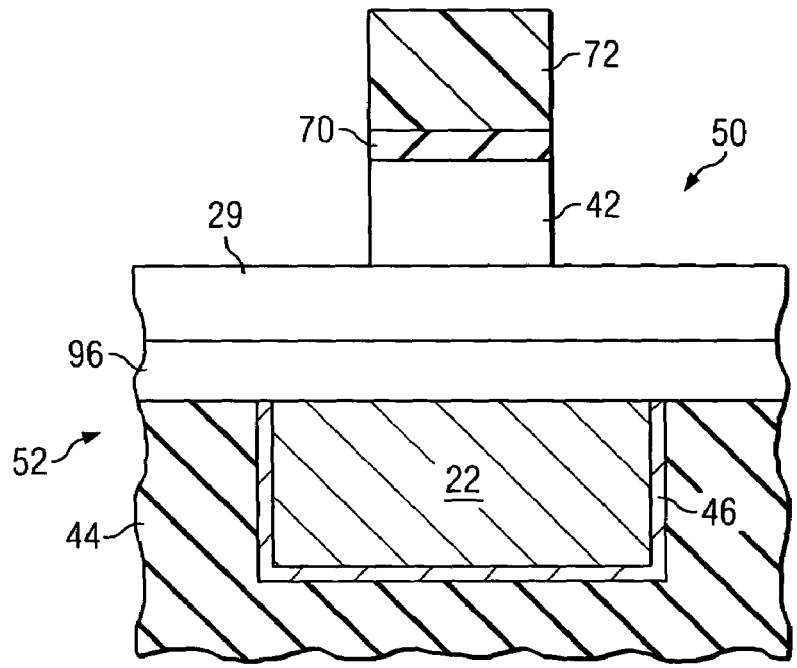
Figure 20:
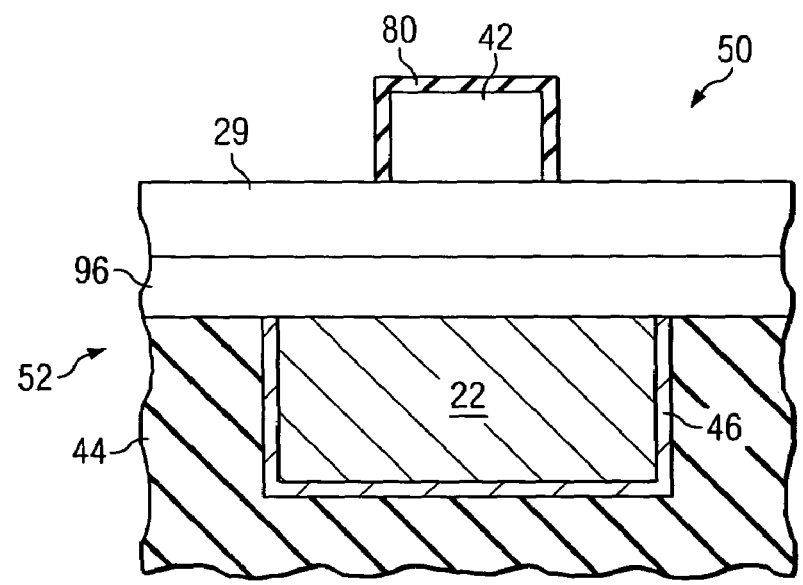

FIG. 18 shows the structure 50 after the ARC layer 70 is opened in alignment with the patterned photoresist layer 72. In the second embodiment, the hard mask 42 is etched and patterned completely before removing the photoresist layer 72, as shown in FIG. 19. As shown in FIG. 20, the sides of the hard mask 42 are plasma oxidized during (or during and after) the removal of the photoresist layer 72 (and the ARC layer 70) using an oxygen containing plasma, such as an $O_2$ and Ar gas mixture, for example. If needed or desired, the oxygen-based plasma used to remove the photoresist layer 72 and ARC layer 70 may be continued after these layers 70, 72 are removed to further plasma oxidize the top surface of the hard mask 42.

An advantage of this process flow of the second embodiment is that the hard mask 42 may be oxidized using the same etch recipe step that is used to strip the photoresist layer 72 and ARC layer 70. A possible disadvantage of the second embodiment is that a fence (not shown) of redeposited material (e.g., hard mask and/or MTJ stack material) may develop on the sidewalls of the photoresist layer 72, which is typically not removed during the photoresist stripping process. Such fencing is undesirable in most cases. Whether a fence develops during the hard mask etch may depend upon the thickness of the hard mask 42, the etch recipe used, the material(s) used for the hard mask 42 (e.g., etch selectivity between various layers comprising the hard mask 42), and/or the etch time. Any or all of these factors may affect whether or not the MTJ stack 29 gets exposed during the hard mask etch. Exposure and/or etching of the MTJ stack 29 prior to removing the photoresist layer 72 is one of the primary causes of fencing problems.

Figure 21:
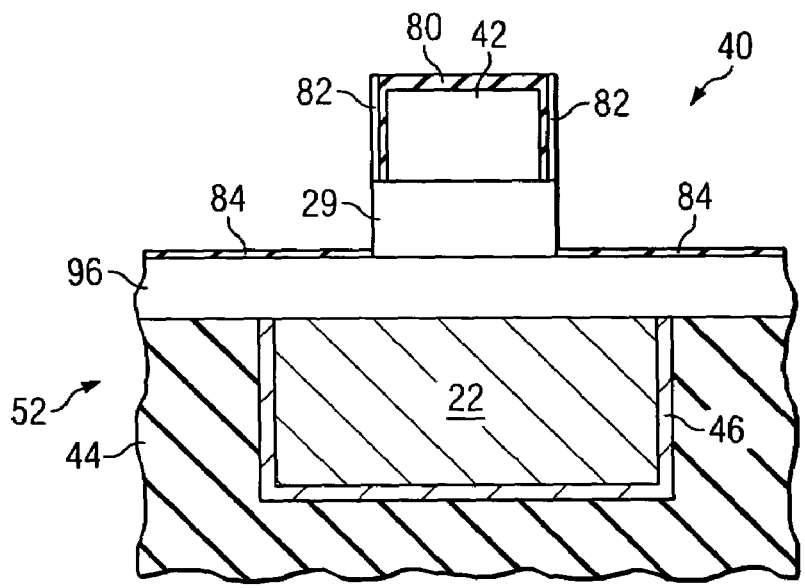
Figure 22:
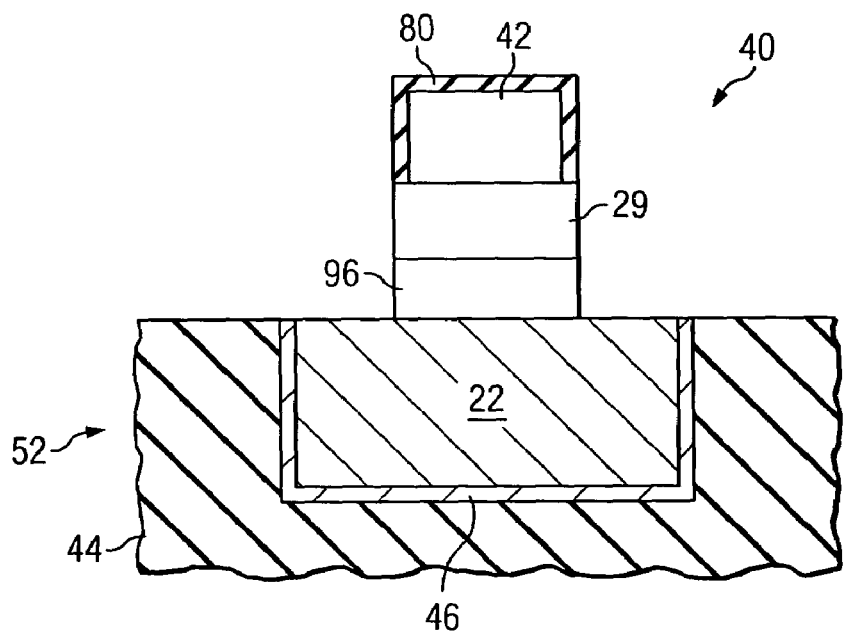
Figure 23:
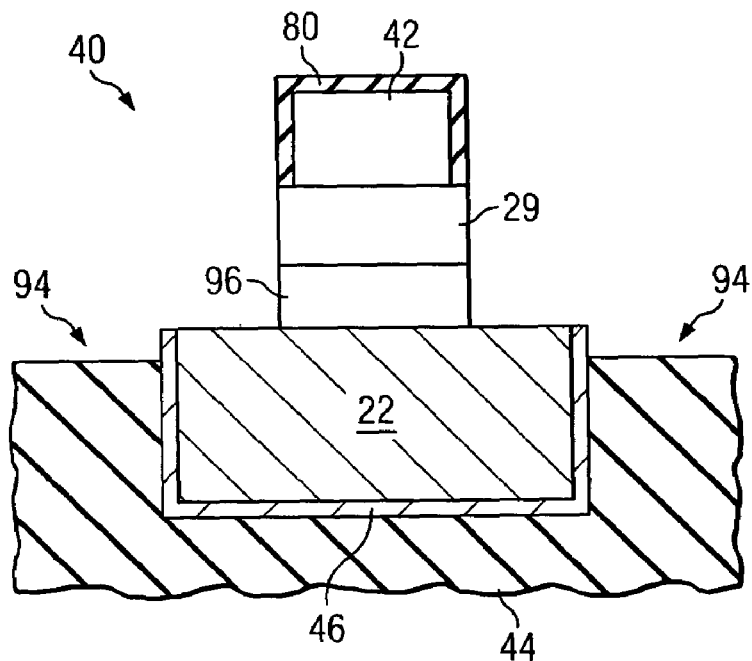
FIG. 23 illustrates an optional variation on the second embodiment.

The remaining steps for the second embodiment shown in FIGS. 21 and 22 may be the same as those described above for the first embodiment, for example. If needed or desired, an overetch may be performed (as an alternative or optional step of the second embodiment, as shown in FIG. 23 (at arrow 94). An overetch of about 20 nm may provide a desired result, for example. Such overetching may be needed or desired to ensure that there is no short between adjacent conducting lines 22 via remaining portions of the bottom layer 96, for example. The etching of the insulating material 44 may be performed in the same chamber in which the MTJ stack etch was performed. The need for such an overetch may depend upon the ability to detect the etching end point of the MTJ stack layer 29 and/or the bottom layer 96. The ability to detect the etching end point may depend upon the etch recipe used, the plasma source, the etch rate, and/or the material(s) chosen for the bottom layer 96, for example.

The process of performing the MTJ stack etch may include the use of an etch chemistry having a $Cl_2$ flow rate, an $O_2$ flow rate, and an Ar flow rate. The $Cl_2$ flow rate may be about 20–60% of the total flow rate, the $O_2$ flow rate may be about 10–40% of the total flow rate, and the Ar flow rate may be about 20–35% of the total flow rate, for example. The total flow rate may be between about 50 and 500 sccm, for example. And, the MTJ etch may be at a pressure between about 1 and 20 mTorr, for example.

It will be appreciated by those skilled in the art having the benefit of this disclosure that embodiments the present invention provide methods of fabricating a magnetic tunnel junction device. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of fabricating a magnetic tunnel junction (MTJ) device, comprising:
   providing an initial structure comprising:
   an underlying layer;
   a bottom tantalum nitride layer over the underlying layer,
   a tantalum layer over the bottom tantalum nitride layer,
   an MTJ stack over the tantalum layer,
   a tantalum nitride cap layer over the MTJ stack,
   a titanium layer over the tantalum nitride cap layer,
   a titanium nitride layer over the titanium layer, and
   a patterned photoresist layer over the titanium nitride layer;
   etching through a majority of the titanium nitride layer with a first etch recipe;
   etching through a remainder of the titanium nitride layer and a first portion of the titanium layer with a second etch recipe;
   removing the photoresist layer;
   etching through a remainder of the titanium layer and at least a majority of the tantalum nitride cap layer with a third etch recipe;
   oxidizing the titanium nitride layer, the titanium layer, and the tantalum nitride cap layer to form a surface oxide thereon;
   etching the MTJ stack with a fourth etch recipe; and
   etching the tantalum layer and the bottom tantalum nitride layer with a fifth etch recipe.

2. The method of claim 1, further comprising:
   rinsing with de-ionized water after etching the bottom tantalum nitride layer.

3. The method of claim 1, wherein the underlying layer is an insulating material having a conducting line formed therein.

4. The method of claim 3, wherein the insulating material is $SiO_2$, and wherein the conducting line comprises a liner layer and a copper line.

5. The method of claim 1, wherein the MTJ stack comprises:
   a platinum manganese layer;
   a cobalt iron layer over the platinum manganese layer;
   an aluminum oxide layer over the cobalt iron layer; and
   a nickel iron layer over aluminum oxide layer.

6. The method of claim 1, wherein the etching through the majority of the titanium nitride layer goes through about 90% of a total thickness of the titanium nitride layer.

7. The method of claim 1, wherein the first etch recipe comprises a flow of at least one of $Cl_2$ and $NF_3$.

8. The method of claim 7, wherein the first etch recipe comprises:
   a flow of $Cl_2$ at about 40 sccm;
   a flow of $NF_3$ at about 4 sccm;
   a plasma source power of about 2000 watts;
   a plasma bias power of about 220 watts; and
   a pressure of about 2.5 mTorr.

9. The method of claim 1, wherein the second etch recipe comprises a fluorine-based etch chemistry.

10. The method of claim 9, wherein the second etch recipe comprises:
    a flow of $CF_4$ at about 10 sccm;
    a flow of $CHF_3$ at about 5 sccm;
    a flow of Ar at about 60 sccm;
    a plasma source power of about 1000 watts;
    a plasma bias power of about 100 watts; and
    a pressure of about 2.5 mTorr.

11. The method of claim 1, wherein the removing of the photoresist layer is performed using a flow of at least one of $O_2$ and Ar.

12. The method of claim 1, wherein the removing of the photoresist layer is performed before the etching with the third etch recipe.

13. The method of claim 1, wherein the third etch recipe comprises a fluorine-based etch chemistry.

14. The method of claim 13, wherein the third etch recipe comprises:
    a flow of $CF_4$ at about 10 sccm;
    a flow of $CHF_3$ at about 5 sccm;
    a flow of Ar at about 60 sccm;
    a plasma source power of about 1000 watts;
    a plasma bias power of about 100 watts; and
    a pressure of about 2.5 mTorr.

15. The method of claim 1, wherein the oxidizing to form the surface oxide is a plasma oxidation performed under conditions comprising:
    a flow of $O_2$ at about 50 sccm;
    a flow of Ar at about 50 sccm;
    a plasma source power of about 1500 watts;
    a plasma bias power of about 25 watts; and
    a pressure of about 5 mTorr.

16. The method of claim 1, wherein the surface-oxidized titanium nitride, titanium, and tantalum nitride cap layers provide a hard mask structure for the etching of the MTJ stack.

17. The method of claim 1, wherein the fourth etch recipe comprises a flow of at least one of $Cl_2$, $O_2$, and Ar.

18. The method of claim 17, wherein the fourth etch recipe comprises:
    a flow of $Cl_2$ at about 40 sccm;
    a flow of $O_2$ at about 10 sccm;
    a flow of Ar at about 20 sccm;
    a plasma source power of about 2500 watts;
    a plasma bias power of about 250 watts; and
    a pressure of about 2.5 mTorr.

19. The method of claim 18, wherein the fourth etch recipe further comprises:
    a self-bias voltage between about −350 and about −380 volts.

20. The method of claim 1, wherein the fifth etch recipe comprises a fluorine-based etch chemistry.

21. The method of claim 20, wherein the fifth etch recipe comprises:
    a flow of $CF_4$ at about 60 sccm;
    a flow of $O_2$ at about 5 sccm;
    a flow of Ar at about 10 sccm;
    a plasma source power of about 1000 watts;
    a plasma bias power of about 100 watts; and
    a pressure of about 2.5 mTorr.

22. The method of claim 21, wherein the fifth etch recipe further comprises:
    a self-bias voltage between about −90 and about −110 volts.

23. The method of claim 1, further comprising:
    over-etching with the fifth etch recipe to remove up to about 90 nm of the underlying layer.

24. The method of claim 1, wherein the initial structure further comprises a patterned ARC layer located between the photoresist layer and the titanium nitride layer, and wherein the removing of the photoresist layer also removes the ARC layer.

25. The method of claim 1, wherein at least one of the tantalum layer and the bottom tantalum nitride layer are oxidized upon exposure to the fourth etch recipe.

26. The method of claim 1, wherein an end point for the etching of the MTJ stack with the fourth etch recipe is measured with an end point function selected from a group consisting of optical emission spectroscopy, residual gas analysis, laser interferometry, interferometric end point, and full wafer imaging interferometry.

27. The method of claim 1, wherein the etching of the MTJ stack with the fourth etch recipe is a timed etch.

28. The method of claim 1, wherein the etching of the MTJ stack with the fourth etch recipe is extended as an overetch for an etch time between 0 and about 1000 seconds to remove redeposited material from sidewalls of the MTJ stack to prevent shorting across a tunnel barrier layer of the MTJ stack.

29. The method of claim 1, wherein timing for the etching with the fifth etch recipe is adjusted to remove redeposited materials from sidewalls of the MTJ stack to prevent shorting across a tunnel barrier layer of the MTJ stack.

* * * * *

UNITED STATES PATENT AND TRADEMARK OFFICE
CERTIFICATE OF CORRECTION

PATENT NO. : 6,984,529 B2
DATED : January 10, 2006
INVENTOR(S) : Stojakovic et al.

It is certified that error appears in the above-identified patent and that said Letters Patent is hereby corrected as shown below:

<u>Title page,</u>
Item [75], Inventors, delete "Neutzel, Fishkill, NY" and insert -- Nuetzel, Dresden (DE) --.

Signed and Sealed this

Twenty-fifth Day of April, 2006

JON W. DUDAS
*Director of the United States Patent and Trademark Office*